(12) United States Patent
Massoudi et al.

(10) Patent No.: US 12,270,857 B2
(45) Date of Patent: Apr. 8, 2025

(54) SIGNAL INTEGRITY MONITORING SYSTEM

(71) Applicant: Synopsys, Inc., Sunnyvale, CA (US)

(72) Inventors: Firooz Massoudi, Palo Alto, CA (US); Abhijeet Prakash Samudra, Santa Clara, CA (US)

(73) Assignee: Synopsys, Inc., Sunnyvale, CA (US)

( * ) Notice: Subject to any disclaimer, the term of this patent is extended or adjusted under 35 U.S.C. 154(b) by 63 days.

(21) Appl. No.: 18/207,045

(22) Filed: Jun. 7, 2023

(65) Prior Publication Data

US 2024/0410943 A1 Dec. 12, 2024

(51) Int. Cl.
*G01R 31/317* (2006.01)
*G01R 31/30* (2006.01)
*H03K 5/135* (2006.01)

(52) U.S. Cl.
CPC ... *G01R 31/31726* (2013.01); *G01R 31/3016* (2013.01); *H03K 5/135* (2013.01)

(58) Field of Classification Search
CPC .......................... G01R 31/31726; H03K 5/135
USPC .......................................................... 327/161
See application file for complete search history.

(56) References Cited

U.S. PATENT DOCUMENTS

| | | | | |
|---|---|---|---|---|
| 7,135,902 B1* | 11/2006 | Ziazadeh | ............... | H03L 7/0812 327/158 |
| 2011/0316589 A1* | 12/2011 | Kim | ....................... | H03H 11/16 327/261 |
| 2014/0015562 A1* | 1/2014 | Dwivedi | ............... | G11C 29/023 324/555 |
| 2016/0034014 A1* | 2/2016 | Turullols | ............... | H03K 3/037 327/225 |
| 2023/0011710 A1* | 1/2023 | Chi | ........................ | H03K 5/00 |

* cited by examiner

*Primary Examiner* — William Hernandez
(74) *Attorney, Agent, or Firm* — Patterson + Sheridan, LLP

(57) ABSTRACT

Certain aspects are directed to apparatus and methods for signal integrity monitoring. The method generally includes: receiving a data signal; generating a first set of delayed versions of the data signal via a plurality of delay elements; comparing each of the first set of delayed versions of the data signal with a clock signal; and generating an output signal based on the comparison.

19 Claims, 7 Drawing Sheets

SIGNAL INTEGRITY MONITORING SYSTEM

TECHNICAL FIELD

The present disclosure generally relates to a signal integrity monitor, and more particularly, to a signal integrity monitor having flip flops for comparing delayed versions of a data signal to a clock signal.

BACKGROUND

An integrated circuit (e.g., a chip) is a device with a large number of interconnected electronic components on a semiconductor. The performance of the integrated circuit is dependent on the quality of signals that are communicated in the integrated circuit. Two important types of signals include a clock signal and a data signal. Data signals represent information communicated between components and clock signals provide timing information for synchronization of operations within the integrated circuit. As integrated circuits have become more complex and operate at higher speeds, signal integrity issues such as reflections, noise, and crosstalk have become increasingly challenging to manage. Therefore, what is needed are apparatus and techniques for monitoring the integrity of signals to manage the operations of the integrated circuit.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure are directed to a signal integrity monitor. The signal integrity monitor may include: a plurality of flip flops (FFs) having data inputs configured to receive a clock signal; and a first delay path having a first plurality of delay elements, wherein clock inputs of at least a first subset of the plurality of FFs are coupled to the first delay path.

Certain aspects provide a method for signal integrity monitoring. The method generally includes: receiving a data signal; generating a first set of delayed versions of the data signal via a plurality of delay elements; comparing each of the first set of delayed versions of the data signal with a clock signal; and generating an output signal based on the comparison.

Certain aspects provide an apparatus for signal integrity monitoring. The method generally includes: means for generating a first set of delayed versions of a data signal; means for comparing each of the first set of delayed versions of the data signal with a clock signal; and means for generating an output signal based on the comparison.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Certain aspects of the present disclosure are directed toward a signal integrity monitoring system. The signal integrity monitoring system may include a SIM controller (SIMC) and a chain of signal integrity monitors (SIMs). Each SIM may be designed to measure the timing margin for a clock signal of chip-to-chip interfaces. The SIM monitors the signal integrity at the receiver end of each chip-to-chip interface. The SIMs may be connected in a ring topology to a controller (SIMC), as described in more detail herein. The SIM may monitor the timing relationship between data and clock transitions. In some aspects, the SIM may generate a data value representing the timing of an edge of a data signal to an edge of a clock signal. The SIM may measure the timing for the data signal's falling or rising edge to the clock signal's falling or rising edge. The SIM output may be generated based on a command sent to the SIM via an interface between the SIM and the SIMC. The SIM output may be collected again through the same interface. Each SIM may monitor the signal integrity of one lane (e.g., providing clock and data signals) between chips.

Advantages of the present disclosure include, but are not limited to, providing a power and area-efficient system for testing and monitoring of interfaces between integrated circuits of an electronic device, allowing for analysis of interface pins and identification of root cause of errors. The signal integrity monitoring techniques described herein increase the reliability of electronic devices with many die-to-die interface pins by providing an integrated monitoring system as part of the electronic device. Certain aspects allow for capturing signal integrity results at a high resolution using multiple delay paths, as described in more detail herein. Signal integrity results may be captured and held for later retrieval for analysis, such as for generating eye diagrams to identify signal degradation.

Figure 1:
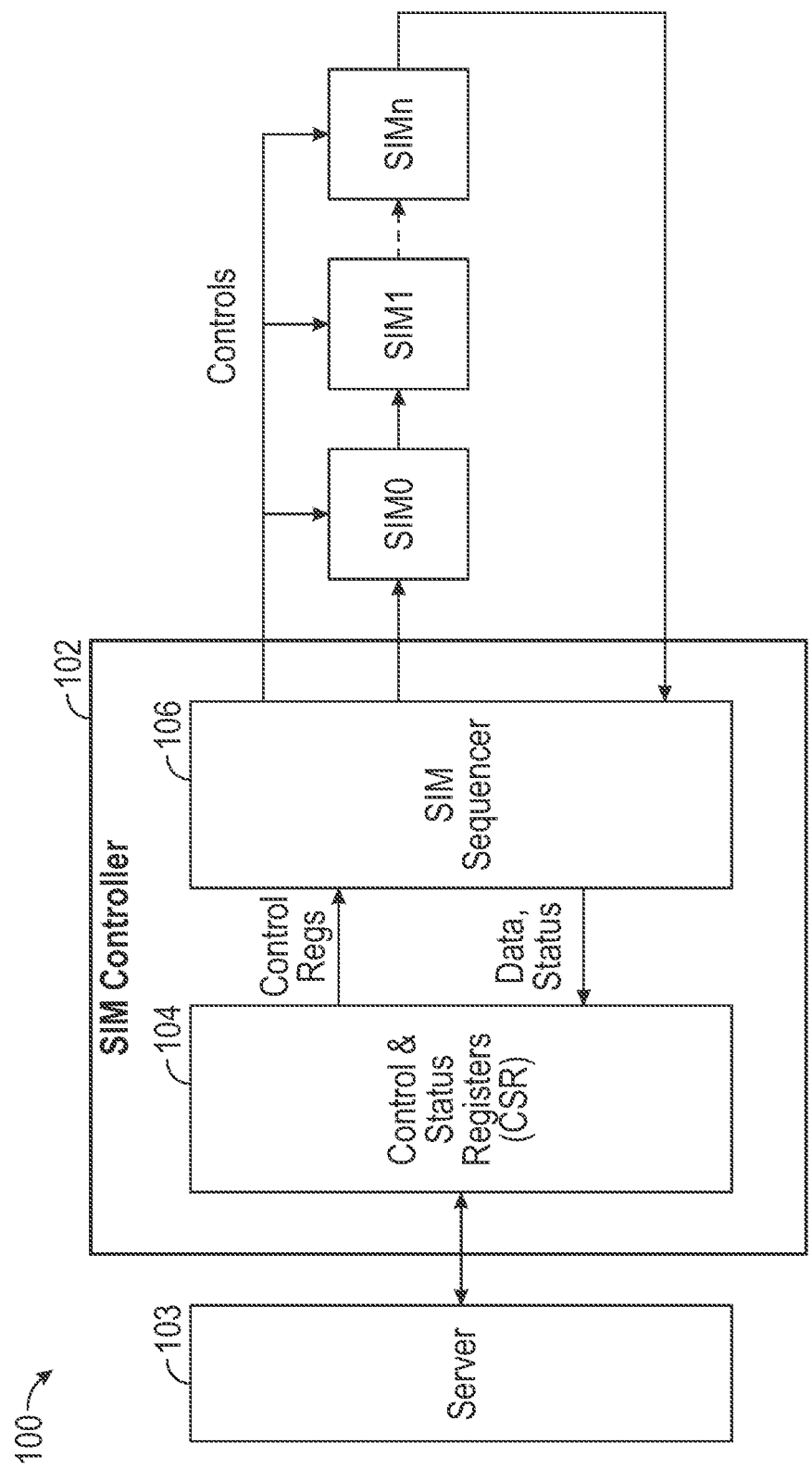
FIG. 1 illustrates a signal integrity monitoring system, in accordance with certain aspects of the present disclosure.

FIG. 1 illustrates a SIM system 100 including a SIM chain (SIM0 to SIMn, n being an integer greater than 1), in accordance with certain aspects of the present disclosure. The SIM system 100 includes a SIM controller 102 having a control and status register (CSR) component 104 driven by an interface and a SIM sequencer 106. The data clocked out by the SIM chain may be collected into a data register by the CSR component 104 and via the SIM sequencer 106, as described in more detail herein. As shown, the SIM controller 102 may be connected to a server 103, which drives the SIM controller 102 via an interface. The server 103 may be connected to at least one interface (e.g., advanced peripheral bus (APB) interface (I/F)) driven from a computing device.

The serial clock to the SIM chain may be controlled by the SIM sequencer 106. The clock input to the SIM sequencer may be a continuous (ungated) clock. The clock may be used as the serial clock to control the chain of SIMs. Each SIM unit of the chain is a monitor which measures the time relationship between a data transition to a clock edge. In certain aspects, only one measurement may be performed at a time, and the SIM unit may hold that measurement until the data is collected and a new measurement cycle is enabled. As shown, the SIM chain may be coupled to the SIM controller in a ring topology (e.g., chained in a serial manner). Thus, the output data of the SIMS of the SIM chain may be received by the SIM controller 102 in a serial manner, as described in more detail herein.

Figure 2A:
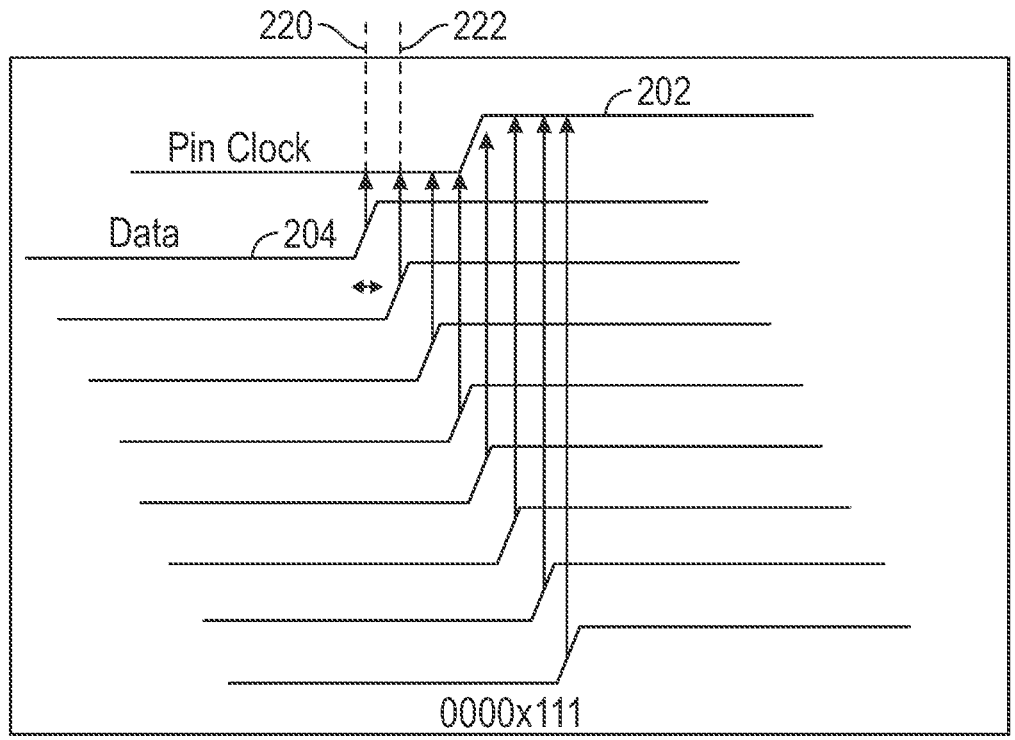
FIGS. 2A and 2B illustrate example data and clock signals used to measure a timing relationship, in accordance with certain aspects of the present disclosure.
Figure 2B:
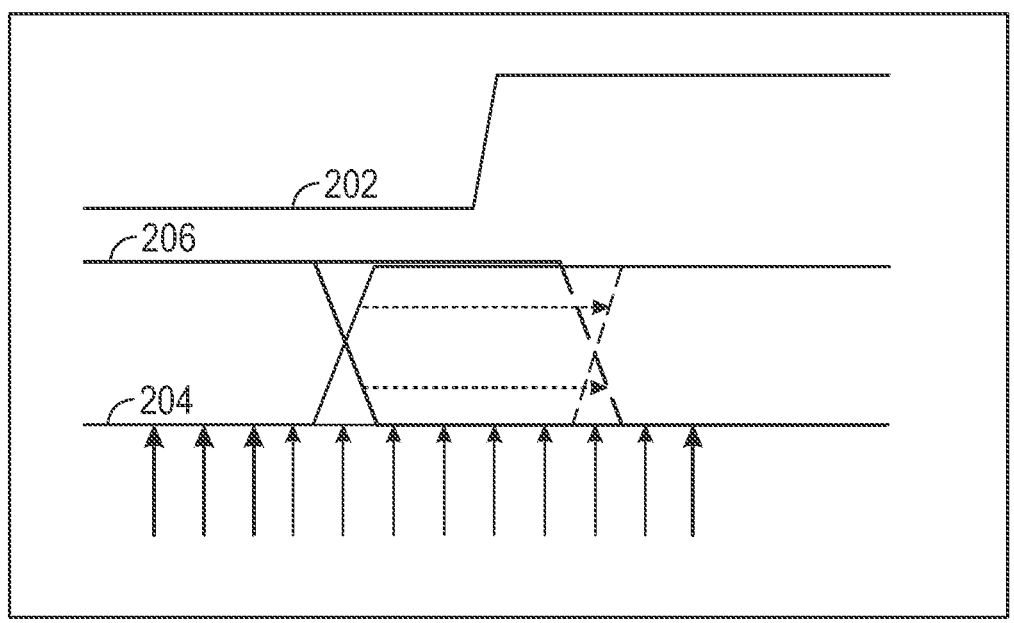

FIGS. 2A and 2B illustrate example data and clock signals used to measure a timing relationship, in accordance with certain aspects of the present disclosure. In some aspects, a data signal may be, in effect, used as a clock. As shown in FIG. 2A, successively delayed versions of the data signal 204 may be generated and used to sample a clock signal 202, as shown. Sixteen data delay stages may be used, in some implementations. Each delayed version of the data signal 204 may be compared to the clock signal 202 to determine the timing relationship between the data signal 204 and the clock signal 202 (e.g., each delayed version of the data signal 204 is used to sample the clock signal 202). For example, in the example shown in FIG. 2A, if the data signal 204 is logic high and the clock signal is logic low, the SIM may output a logic low, and if both the data signal 204 and the clock signal 202 are logic high, the SIM may output a logic high. The output of the SIM may be used to identify the timing relationship between the data signal and the clock signal. In some cases, as shown in FIG. 2B, a first data signal 204 or a second complementary data signal 206 may be used for comparison to the clock signal 202. As used herein, the data signal being compared to the clock signal may refer to the sampling of the value of the clock signal (e.g., clock-as-data) using delayed versions of the data signal (e.g., data-as-clock).

The delay stages may be small (~5 ps), and uniform, in some aspects. The clock state may be captured in the register chain and read out serially by the controller during a collect phase of the SIM chain. The digital pattern generated gives information about the timing of data transitions relative to clock transitions. An eye diagram may be generated by collecting timing information for a large number of transitions over time and super-imposing them.

The operation of the SIM system 100 can be classified into a measurement phase and a collect phase. During the measurement phase, the SIMS wait for the appropriate data transition (rising or falling edge of data) and measure the time to the immediately following clock edge (rising or falling). The time is measured in delay steps. During the collect phase, the data collected by all the SIMS is collected by the SIMC in a serial manner, and then monitored/read out by the system processing unit (e.g., processing device 702 of FIG. 7) for analysis.

In some aspects, the logic of each SIM may be designed so that the timing measurement occurs on the second edge of the data, as described in more detail herein. Once the SIM makes a measurement, the measurement is held until a control signal is used to begin a collect phase. During the collect phase, the measured result is clocked out via a serial clock. After the collect phase, the SIM transitions back into a measurement phase again.

Figure 3:
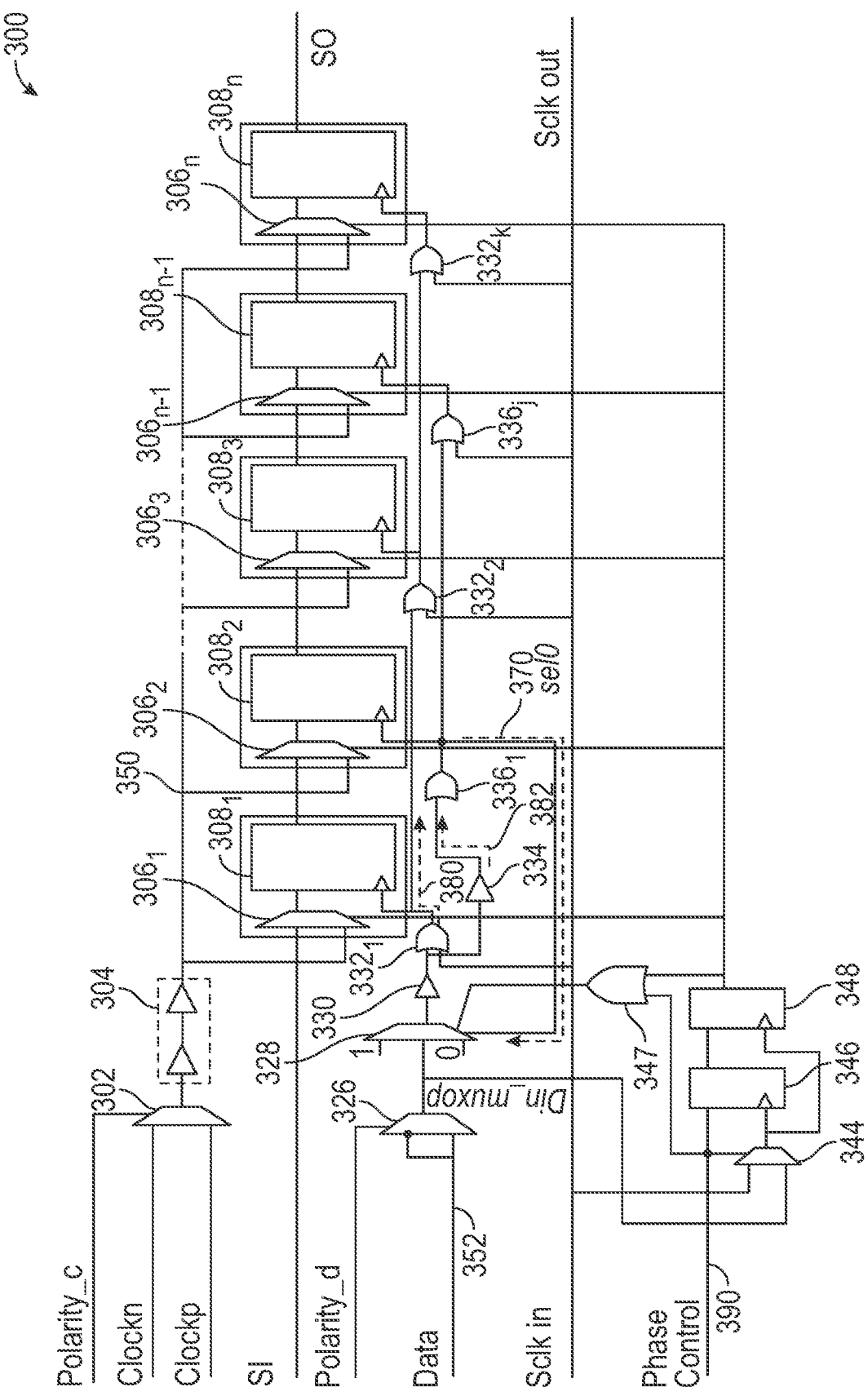
FIG. 3 illustrates an example signal integrity monitor (SIM) including flip flops (FFs) for measuring a timing relationship between a data signal and a clock signal, in accordance with certain aspects of the present disclosure.
Figure 4:
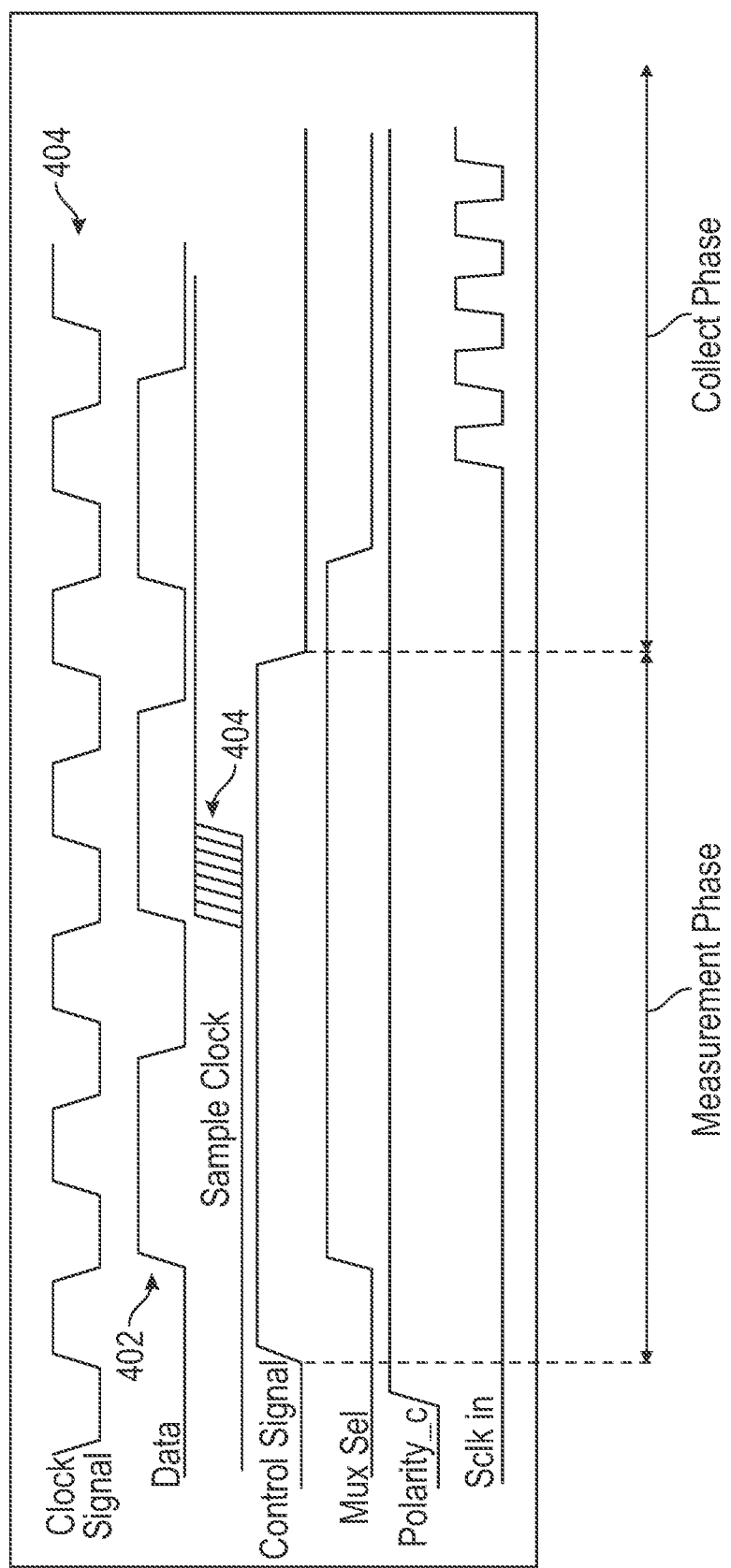
FIG. 4 is a timing diagram illustrating various signals of a SIM, in accordance with certain aspects of the present disclosure.

FIG. 3 illustrates an example SIM 300 including flip flops (FFs) for measuring a timing relationship between a data signal and a clock signal, in accordance with certain aspects of the present disclosure. FIG. 4 is a timing diagram illustrating various signals of the SIM 300, in accordance with certain aspects of the present disclosure. As shown in FIG. 3, the SIM 300 may include FFs $308_1$ to $308_n$ (collectively referred to herein as FFs 308) having inputs coupled to respective multiplexers $306_1$ to $306_n$ (collectively referred to herein as multiplexers 306), as shown. As shown, an input of each of the multiplexers 306 may receive a clock signal 350. Another input of each of the multiplexers 306 may be used to chain the FFs 308. For example, the other input of multiplexer $306_1$ may be coupled to an input of the SIM 300 (e.g., a serial input labeled "SI"), the other input of multiplexer $306_2$ may be coupled to an output of FF $308_1$, and so on. The output of FF $308_n$ is coupled to a serial output (SO) of SIM 300. Thus, by controlling the multiplexers 306, the data inputs of FFs 308 may either receive the clock signal 350, or the FFs 308 may be daisy chained between SI and SO of the SIM 300 for collection of measurement results, as described in more detail herein.

As shown, the clock signal 350 may be selected, by the multiplexer 302, from either a positive polarity clock signal (labeled "Clockp") or a negative polarity clock signal (labeled "Clockn"), based on a polarity control signal (labeled "Polarity_c") (e.g., also referred to herein as a "polarity selection signal"). For example, as shown in FIG. 4, the polarity control signal (Polarity_c) may be logic high to provide the positive polarity clock signal to the multiplexers 306.

As shown, the SIM 300 may include a multiplexer 326 having inputs receiving the data signal 352 and a complementary version of the data signal 352. Based on a data polarity control signal (labeled "Polarity_d"), either a positive polarity data signal or a negative polarity data signal may be provided to an input of a multiplexer 328, as shown.

The output of the multiplexer 328 may be provided to clock inputs of FFs 308 through delay elements (e.g., OR gates). Each OR gate delays the data signal to be provided to a respective FF. Thus, the OR gates generate multiple delayed versions of the data signal to be provided to the clock inputs of the FFs 308, respectively. The output of multiplexer 328 may be coupled to a first delay path 380 having a first set of delay elements (e.g., OR gates $332_1$ to $332_k$, hereinafter referred to as OR gates 332), and in some aspects, a second delay path 382 having a second set of delay elements (e.g., OR gates $336_1$ to $336_j$, hereinafter referred to as OR gates 336). For instance, the output of multiplexer 328 may be coupled to an input of OR gate $332_1$ (e.g., through a delay element 330) having an output coupled to a clock input of FF $308_1$. The output of OR gate $332_1$ may be coupled to input of OR gate $332_2$. An output of OR gate $332_2$ may be coupled to the clock input of FF $308_3$. Similarly, the output of OR gate $332_2$ may be coupled to input of OR gate $332_k$, k being any integer greater than 1. The output of OR gate $332_k$ is coupled to the clock input of FF $308_n$, as shown. Each of the OR gates provides a delay Td.

To further increase the resolution associated with sampling the clock signal, a set of OR gates 336 is driven by a separate delay path (e.g., delay path 382) than OR gates 332.

For example, the data signal from the output of the multiplexer 328 may be provided to an input of OR gate $336_1$ through a delay element 334 (e.g., buffer). The delay element 334 may provide a delay that is half the delay Td associated with each of the OR gates. Thus, the total delay provided by the delay element 334 and the OR gate $336_1$ may be 1.5 Td. The output of OR gate $336_1$ may be provided to an input of OR gate 336j having an output coupled to the clock input of FF $308_{n-1}$. In this manner, the clock input of FF $308_1$ may receive the data signal delayed by Td, the clock input of FF $308_2$ may receive the data signal delayed 1.5 Td, the clock input of FF $308_3$ may receive the data signal delayed by 2 Td, and so on. Thus, a sampling resolution of 0.5 Td may be obtained by implementing the separate delay paths as described. The sampling resolution refers to the delay between consecutive samples of the clock signal. For instance, referring back to FIG. 2A, the sampling resolution may refer to the delay between time 220 and time 222 when the data signal (or the delayed version thereof) is compared to the clock signal. While two delay paths are implemented to obtain a sampling resolution of 0.5 Td, any number of delay paths may be used. For example, four delay paths may be used in some aspects to obtain a sampling resolution 0.25 Td.

As shown, the other inputs of OR gates 332 and 336 receive a serial clock signal (labeled "Sclk in"), as shown. When the serial clock signal is logic low, the outputs of the OR gates 332, 336 are effectively controlled by the delayed data signals as described. Thus, the SIM 300 is effectively in a measurement phase (e.g., a sample and hold phase). As shown, the SIM 300 may include a multiplexer 344 having inputs receiving the serial clock signal and the data signal at the output of multiplexer 326 (labeled "Din_muxop"). To begin the measurement phase, the control signal 390 may transition from logic low to logic high (e.g., as shown in FIG. 4) such that the multiplexer 344 provides the Din_muxop to the clock input of FFs 346, 348.

As shown, the control signal 390 may also be provided to the data input of FF 346, where the output of the FF 346 is provided to the data input of FF 348. The output of FF 348 is used to control the multiplexers 306 in order for the multiplexers 306 to provide the clock signal 350 to the respective FFs 308. Thus, when control signal 390 transitions to logic high to begin the measurement phase, the FFs 346, 348 facilitate skipping of one data signal cycle (e.g., cycle 402 shown in FIG. 4) before the multiplexers 306 provide the clock signal 350 to the respective FFs 308, allowing time for the signaling of the SIM 300 to stabilize before sampling begins.

Moreover, the control signal 390 may be provided to an input of an OR gate 347, where the other input of OR gate 347 is coupled to an output of FF 348. The output of the OR gate 347 transitions to logic high based on the control signal 390 transitioning to logic high. The output of OR gate 347 is coupled to a control input of multiplexer 328. Thus, based on the output of OR gate 347 transitioning to logic high, the multiplexer 328 provides to Din_muxop to the inputs of OR gates $332_1$ and $336_1$, as described. After the clock signal 350 is provided to the FFs 308 and Din_muxop to the inputs of OR gates 3321 and 3361, each FF samples the clock signal 350 based on the delayed data signals (e.g., sample clocks 404 of FIG. 4), as described herein.

In some aspects, a feedback path 370 may be coupled between the input of OR gate 336j and a control input of the multiplexer 328. When the input to the OR gate 336j (e.g., output of OR gate $336_1$) transitions to logic high, the output of the multiplexer 328 transitions to logic low (e.g., so that the output of multiplexer 328 is no longer controlled by the data signal). Thus, the result of the sampling is held in each FF until a collect phase of the SIM 300 begins.

To provide accurate measurement results, the delay associated with multiplexer 326, multiplexer 328, and delay element 330 should be compensated for on the path for providing the clock signal 350 to the FFs 308. Thus, a delay stage 304 may be coupled between the output of multiplexer 302 and the inputs of multiplexers 306. The delay stage 304 provides a delay before the clock signal 350 is provided to the FFs 308, corresponding to the delays associated with multiplexer 328 and delay element 330.

To begin the collect phase, the control signal 390 transitions from logic high to logic low, as shown in FIG. 4. In response, the multiplexers 306 are controlled to daisy chain the FFs 308, as described herein. As shown in FIG. 4, the serial clock signal is toggled between logic high and logic low during the collect phase to sequentially output the measurement results held by FFs 308 to the serial output (SO).

The SIM 300 operates in a sequence of a measure phase, followed by a collect phase, repeatedly. Referring back to FIG. 1, the various control signals (e.g., for clock and data polarity selection and measurement/collect mode control) for the SIMS (e.g., including SIM 300) may be provided by the SIM controller. During the collect phase, the measurement results held by the SIMs are serially collected. In other words, the SO of SIM0 is coupled to the SI of SIM1, and the SO of SIM1 is coupled to the SI of SIM2, and so on. All SIMs are placed in the collect phase so that the measurement results are provided in a serial manner to the SIM controller 102. The data collected from all the SIMs in the chain is stored in a register.

In some aspects, the SIMs may provide continuous measurements (e.g., when configured in a continuous mode of operation). In continuous mode, the data collected from the SIMs may be over-written continuously. The SIM controller 102 may generate an interrupt when a threshold (e.g., margin) is crossed for any SIM (e.g., the delay between the rising edges of the data signal and the clock signal is less than a threshold). In single-shot mode, the system processing unit controls the measurement and collection operations. The processing unit may read out the measurement results. The CSR component 104 may set up the SIM operations by programming control registers (e.g., to read out serial data from the SIM chain, generate interrupts, and manage interrupt status). The SIM sequencer 106 sets up the SIM chain for operation, generates the control signals and the serial clock signal for the SIMS, collects data from the SIM chain, and generates interrupts based on thresholds.

The SIM controller 102 may have a number of registers that aid in programming various aspects of the SIM system, such as how wide a measurement window (period) is, what is the data polarity for measurement (data rising edge or data falling edge), enable measurement in continuous or single shot mode, and threshold for interrupt generation.

The SIM sequencer generates the appropriate control signals to control the phase of the SIM chain. All the SIMs may go into the collect or measurement phase at the same time. This is controlled based on the state of the collect signal (e.g., control signal 390). In addition to managing the appropriate toggling of the collect signal, the SIM sequencer also manages the pulsing of the serial clock (Sclk in). The sequencer generates the correct number of serial clock pulses needed to read out the data from all SIMs in the chain by controlling the gating of a free-running serial clock.

In continuous mode, the overall system operates in a monitoring mode. The SIM sequencer generates the signals to configure the SIMs into the measure and collect phases. The SIM data is collected by the SIM controller 102 during the collect phase but may not be sent to the system processing unit. Instead, local compare logic may check that each SIM's data is within an allowed threshold. If the value is beyond the allowed threshold, an interrupt is generated to the system processing unit. Based on the interrupt, the processing unit may continue to stay in the continuous mode and keep monitoring, change the threshold and continue monitoring, or go into a single-shot mode where data from each SIM is collected by the processing unit. In continuous mode, the processing unit may not be actively involved in the data collection or measurement which may be controlled by the SIM sequencer logic.

In the single shot mode, the system CPU controls the complete operation of the SIM controller. In this mode, the CPU collects data measured by each SIM, and performs some operations on the data (e.g., to generate an eye diagram). The eye diagram may be generated by reading several measurements and super-imposing the measurements over each other. In this case, the CPU reads out the data from each SIM in the chain over multiple measurement cycles. When the SIM controller 102 operates in continuous mode, the system processing unit may not read the data. Instead, the processing unit depends on the SIM controller 102 to generate an interrupt when the margin detected by any SIM is outside the programmed threshold.

As described, the polarities of the data and clock signals may be selected for each SIM. Thus, different comparison scenarios may be configured. For example, in a first scenario, a data rising edge may be compared with a clock rising edge. In this case, the SIM output would start as all 0s when the clock is sampled low, followed by a series of 1s after the rising edge, when the clock is sampled high.

In a second scenario, the data rising edge is compared with a clock falling edge. In this case, the SIM output would start as all 1s when the clock is sampled high, followed by a series of 0s after the falling edge, when the clock is sampled low.

In a third scenario, the data falling edge is compared to a clock rising edge. In this case, the SIM output would start as all 0s when the clock is sampled low, followed by a series of 1s after the rising edge, when the clock is sampled high.

In a fourth scenario, data falling edge is compared with a clock falling edge. In this case, the SIM output would start as all 1s when the clock is sampled high, followed by a series of 0s after the falling edge, when the clock is sampled low.

Thus, the SIM output may be either a series of 0s followed by a series 1s (e.g., where the number of 0s define a margin compared to a threshold for interrupt generation), or a series of 1s followed by a series of 0s (e.g., where the number of 1s define a margin compared to a threshold for interrupt generation). When the controller reads the output from each SIM, the controller reads out the most significant bit (MSB) first. For example, a data rising edge compared to a clock rising edge with five steps of margin would result in a measured value of 0000_0111_1111_1111. 0000_0111_1111_1111 would be read into the SIM controller 102 as 1111_1111_1110_0000. A data rising edge compared to a clock falling edge with five steps of margin would result in a measured value of 1111_1000_0000_0000. 1111_1000_0000_0000 would be read into the controller as 0000_0000_0001_1111.

Thus, the lowest significance bit which shows the transition represents the margin in delay steps. Thus, to determine whether to generate an interrupt, the controller 102 may determine the transition bit by performing exclusive OR (XOR) operations for each pair of bits of the SIM output. For instance, a sixteen bit input would provide a fifteen bit value, with a single bit set. This corresponds to the number of delay steps (margin) there is. The resultant fifteen bit data from performing the XOR operations for every successive pair of bits would provide a value of 000_0000_0001_0000. Since the fifth bit is set, there are 5 steps of margin available. Thus, this scenario should generate an interrupt only if the threshold being compared to the margin is set to 5 or higher.

Figure 5:
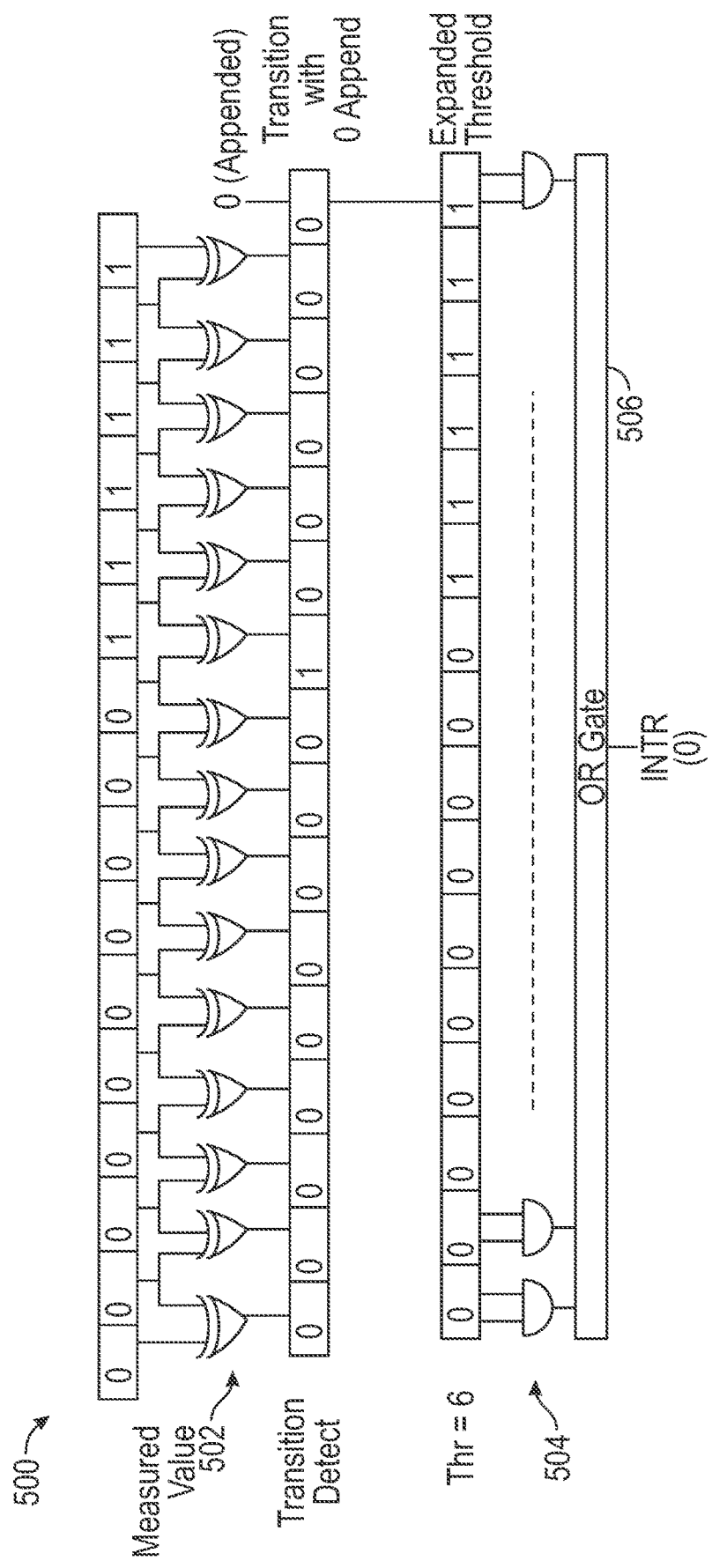
FIG. 5 illustrates logic for generating an interrupt signal, in accordance with certain aspects of the present disclosure.

FIG. 5 illustrates logic 500 for generating an interrupt signal, in accordance with certain aspects of the present disclosure. As shown, the logic 500 performs XOR operations of each successive bit of the measured value (e.g., the SIM output) via XOR gates 502 to generate a 15-bit value, as shown. As shown, the controller may append a 0 to the LSB of the 15-b value, resulting in a transition detection signal of 0000_0000_0010_0000, as shown. The logic 500 may generate a compare vector by performing a left shift of a threshold and subtracting 1 from the left shifted threshold. For example, if the threshold is 6, the compare vector may be 0000_0000_0011_1111, as shown. The logic 500 may include AND gates 504 for performing AND operations of respective bits of the transition detection signal (e.g., labeled "transition detect") and the compare vector (e.g., labeled "expanded threshold"). If the result of the AND operation is non-zero, an interrupt may be generated. For example, the outputs of the AND gates 504 may be provided to an OR gate 506 to generate the interrupt signal.

Figure 6:
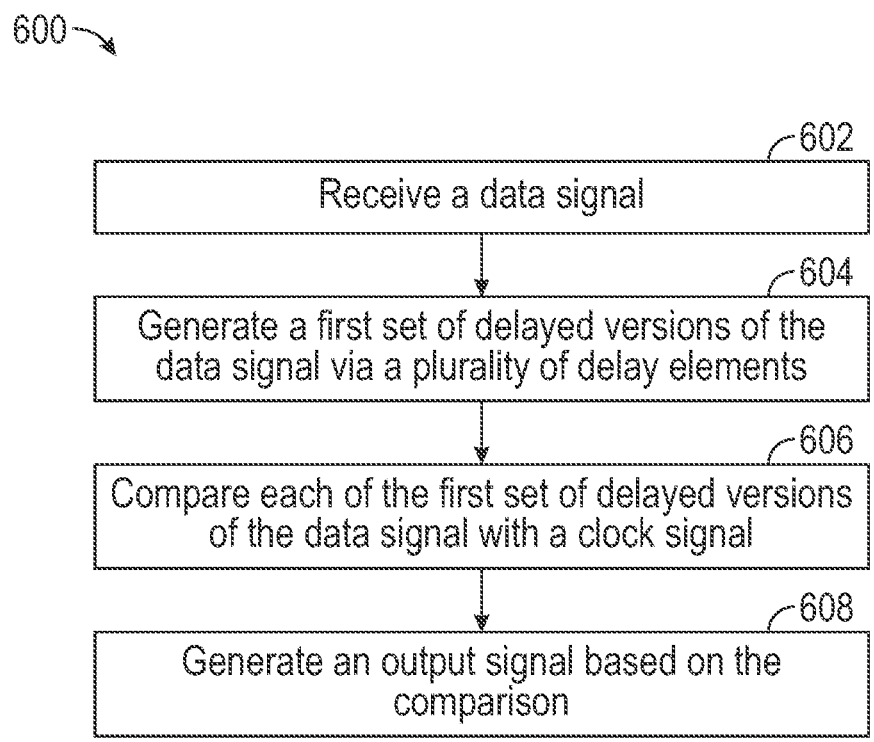
FIG. 6 is a flow diagram illustrating example operations for signal integrity monitoring, in accordance with certain aspects of the present disclosure.

FIG. 6 is a flow diagram illustrating example operations 600 for signal integrity monitoring, in accordance with certain aspects of the present disclosure. The operations 600 may be performed, for example, by a SIM, such as the SIM 300.

At block 602, the SIM may receive a data signal. At block 604, the SIM may generate a first set of delayed versions of the data signal via a plurality of delay elements (e.g., OR gates 332). At block 606, the SIM may compare (e.g., via one or more of FFs 308) each of the first set of delayed versions of the data signal with a clock signal (e.g., clock signal 350). At block 608, the SIM may generate an output signal based on the comparison.

In some aspects, the SIM selects (e.g., multiplexer 302) one of a positive polarity clock signal (e.g., Clockp shown in FIG. 4) or a negative polarity clock signal (e.g., Clockn shown in FIG. 4). The SIM may provide, as the clock signal, the one of the positive polarity clock signal or the negative polarity clock signal based on the selection. In some aspects, the SIM may select one of a positive polarity data signal or a negative polarity data signal, and provide, as the data signal, the one of the positive polarity data signal or the negative polarity data signal based on the selection.

In some aspects, the SIM 300 may select (e.g., via multiplexer 328) the data signal or a constant logic level signal (e.g., a logic low signal), based on one of the delayed versions of the data signal (e.g., based on signal received via feedback path 370). The SIM may provide the data signal or the constant logic level signal to a first delay path including the plurality of delay elements based on the selection.

In some aspects, the first set of delayed versions of the data signal are generated via a first delay path. The SIM may generate a second set of delayed versions of the data signal via a second delay path, and compare each of the second set of delayed versions of the data signal with the clock signal.

The output signal may be generated based on the comparison of the second set of delayed versions of the data signal with the clock signal.

In some aspects, the first set of delayed versions of the data signal may be compared with the clock signal via a plurality of FFs (e.g., FFs 308), the output signal being held by the plurality of FFs during a measurement phase. The SIM may configure the plurality of FFs in a daisy chained configuration during a collection phase, and provide another clock signal (e.g., serial clock input (Sclk in) shown in FIG. 3 and FIG. 4) to clock inputs of the plurality of FFs during the collection phase to provide the output signal to a serial output node (e.g., SO shown in FIG. 3).

Figure 7:
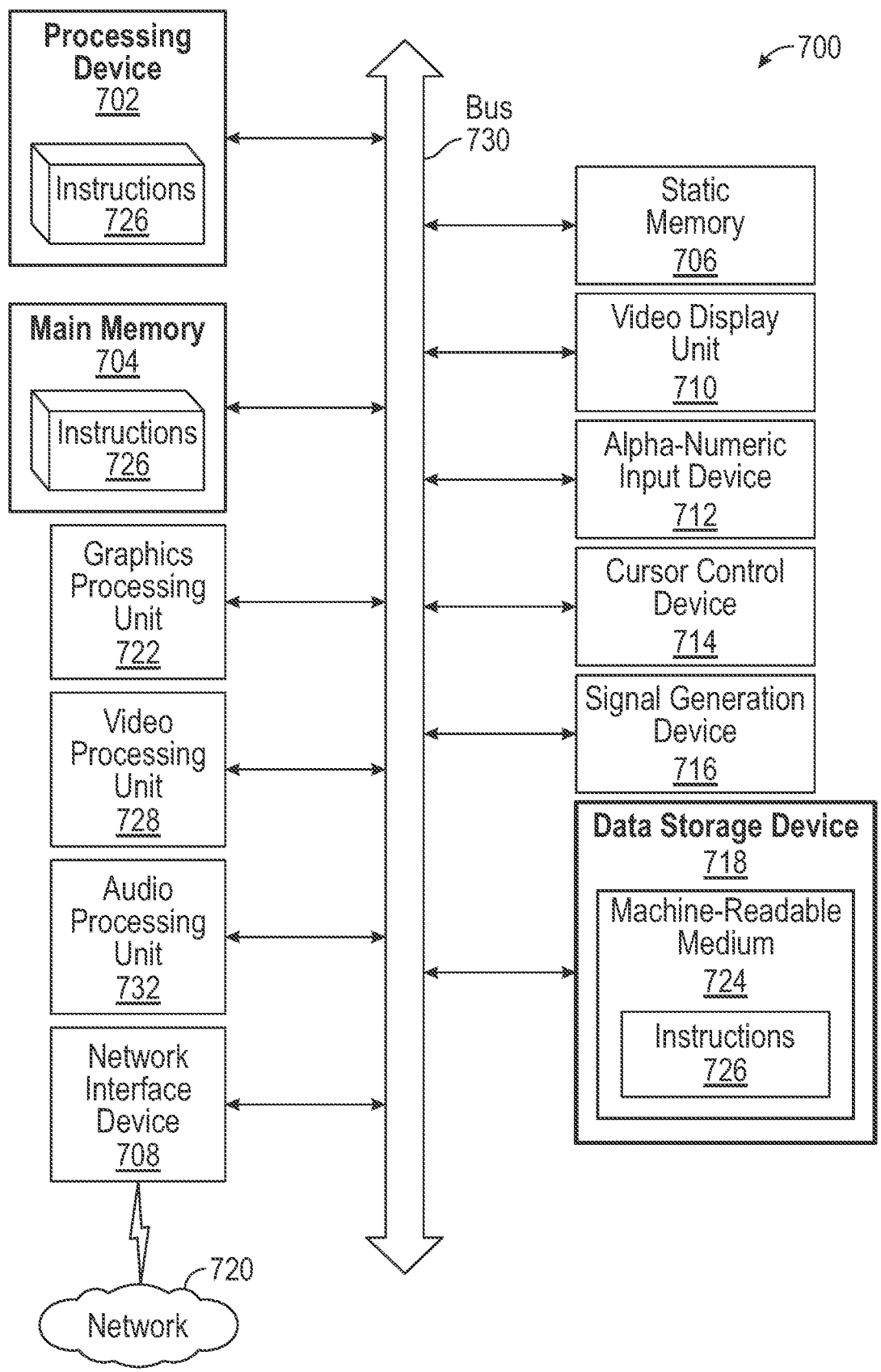
FIG. 7 illustrates an example machine of a computer system within which a set of instructions, for causing the machine to perform any one or more of the methodologies discussed herein, may be executed.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

No claim element is to be construed under the provisions of 35 U.S.C. § 112 (f) unless the element is expressly recited using the phrase "means for" or, in the case of a method claim, the element is recited using the phrase "step for." For example, means for generating delayed version of a data signal may include delay elements, such as OR gates 332 or 336. Means for comparing and means for generating an output signal may include FFs, such as FFs 308.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A signal integrity monitor, comprising:
   a plurality of flip flops (FFs) having data inputs configured to receive a clock signal; and
   a first delay path having a first plurality of delay elements configured to generate delayed versions of a data signal, wherein clock inputs of at least a first subset of the plurality of FFs are coupled to the first delay path and configured to receive the delayed versions of the data signal to sample the clock signal based on the delayed versions of the data signal.

2. The signal integrity monitor of claim 1, wherein:
   the plurality of FFs are configured to compare each of the delayed versions of the data signal with the clock signal to generate an output signal, each of the plurality of FFs being configured to hold a bit of the output signal during a measurement phase of the signal integrity monitor.

3. The signal integrity monitor of claim 2, wherein, during a collection phase, the clock inputs of the plurality of FFs are configured to receive another clock signal to provide the output signal to a serial output node of the signal integrity monitor.

4. The signal integrity monitor of claim 1, further comprising:
   a multiplexer configured to provide the data signal or a constant logic level signal to the first delay path; and
   a feedback path coupled between the first delay path and a control input of the multiplexer.

5. The signal integrity monitor of claim 1, further comprising a multiplexer configured to receive a polarity selection signal and provide, as the data signal, a positive polarity data signal or a negative polarity data signal.

6. The signal integrity monitor of claim 1, wherein the first plurality of delay elements include OR gates.

7. The signal integrity monitor of claim 1, further comprising a second delay path having a second plurality of delay elements, wherein clock inputs of a second subset of the plurality of FFs are coupled to the second delay path.

8. The signal integrity monitor of claim 1, further comprising a plurality of multiplexers having first inputs configured to receive the clock signal.

9. The signal integrity monitor of claim 8, wherein an output of one or more of the plurality of FFs is coupled to a second input of a multiplexer of the plurality of multiplexers.

10. The signal integrity monitor of claim 1, further comprising a plurality of multiplexers having outputs coupled to the data inputs of the plurality of FFs.

11. The signal integrity monitor of claim 10, wherein the plurality of multiplexers are configured to daisy chain the plurality of FFs during a collection phase of the signal integrity monitor.

12. The signal integrity monitor of claim 1, further comprising a multiplexer configured to receive a polarity selection signal and provide, as the clock signal, a positive polarity clock signal or a negative polarity clock signal.

13. A method for signal integrity monitoring, comprising:
   receiving a data signal;
   generating a first set of delayed versions of the data signal via a plurality of delay elements;
   comparing each of the first set of delayed versions of the data signal with a clock signal, wherein the first set of delayed versions of the data signal are compared with the clock signal via a plurality of flip flops (FFs); and
   generating an output signal based on the comparison, the output signal being held by the plurality of FFs during a measurement phase.

14. The method of claim 13, further comprising:
   selecting one of a positive polarity clock signal or a negative polarity clock signal; and
   providing, as the clock signal, the one of the positive polarity clock signal or the negative polarity clock signal based on the selection.

15. The method of claim 13, further comprising:
   selecting one of a positive polarity data signal or a negative polarity data signal; and
   providing, as the data signal, the one of the positive polarity data signal or the negative polarity data signal based on the selection.

16. The method of claim 13, further comprising:
   selecting the data signal or a constant logic level signal, based on one of the delayed versions of the data signal; and
   providing the data signal or the constant logic level signal to a first delay path including the plurality of delay elements based on the selection.

17. The method of claim 13, wherein:

the first set of delayed versions of the data signal are generated via a first delay path;

the method further comprises:

generating a second set of delayed versions of the data signal via a second delay path; and comparing each of the second set of delayed versions of the data signal with the clock signal, the output signal being further generated based on the comparison of the second set of delayed versions of the data signal with the clock signal.

18. The method of claim 13, further comprising:

configuring the plurality of FFs in a daisy chained configuration during a collection phase; and providing another clock signal to clock inputs of the plurality of FFs during the collection phase to provide the output signal to a serial output node.

19. An apparatus for signal integrity monitoring, comprising:

means for generating a first set of delayed versions of a data signal;

a plurality of flip flops (FFs) configured to compare each of the first set of delayed versions of the data signal with a clock signal; and means for generating an output signal based on the comparison, the output signal being held by the plurality of FFs during a measurement phase.

\* \* \* \* \*